United States Patent
Kronholz et al.

(10) Patent No.: US 8,674,458 B2
(45) Date of Patent: Mar. 18, 2014

(54) TRANSISTORS WITH EMBEDDED STRAIN-INDUCING MATERIAL FORMED IN CAVITIES PROVIDED BY AN OXIDIZING ETCH PROCESS

(75) Inventors: Stephan-Detlef Kronholz, Dresden (DE); Rohit Pal, Dresden (DE); Gunda Beernink, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/483,630

(22) Filed: May 30, 2012

(65) Prior Publication Data
US 2012/0306027 A1 Dec. 6, 2012

(30) Foreign Application Priority Data
May 30, 2011 (DE) .......... 10 2011 076 695

(51) Int. Cl.
H01L 21/02 (2006.01)
(52) U.S. Cl.
USPC ............ 257/410; 257/E21.409; 257/E29.255; 257/E21.616; 438/275; 438/285
(58) Field of Classification Search
USPC ............ 257/410, E21.409, E29.255, E21.616
See application file for complete search history.

(56) References Cited

U.S. PATENT DOCUMENTS

| | | | |
|---|---|---|---|
| 7,045,407 B2 * | 5/2006 | Keating et al. | 438/198 |
| 7,190,036 B2 * | 3/2007 | Ko et al. | 257/374 |
| 7,560,758 B2 * | 7/2009 | Zhu et al. | 257/288 |
| 7,851,313 B1 * | 12/2010 | Luo et al. | 438/285 |
| 7,943,479 B2 * | 5/2011 | Pinto et al. | 438/405 |
| 7,994,014 B2 * | 8/2011 | Yang et al. | 438/300 |
| 8,120,075 B1 * | 2/2012 | Luo et al. | 257/288 |
| 8,329,589 B2 * | 12/2012 | Pacheco Rotondaro et al. | 438/705 |
| 8,361,858 B2 * | 1/2013 | Kronholz et al. | 438/219 |
| 2005/0082522 A1 * | 4/2005 | Huang et al. | 257/19 |
| 2005/0112811 A1 * | 5/2005 | Hsu et al. | 438/197 |
| 2006/0148220 A1 * | 7/2006 | Lindert et al. | 438/514 |
| 2007/0004123 A1 * | 1/2007 | Bohr et al. | 438/230 |
| 2007/0072380 A1 * | 3/2007 | Wirbeleit et al. | 438/303 |
| 2007/0249168 A1 * | 10/2007 | Rotondaro et al. | 438/700 |
| 2008/0237634 A1 * | 10/2008 | Dyer et al. | 257/190 |

(Continued)

FOREIGN PATENT DOCUMENTS

DE 102008063427 A1 7/2010 .......... H01L 21/8234

OTHER PUBLICATIONS

Translation of Official Communication from German Patent Office for German Patent Application No. 10 2011 076 695.2 dated Jan. 2, 2012.

*Primary Examiner* — Alexander Sofocleous
*Assistant Examiner* — Ankush Singal
(74) *Attorney, Agent, or Firm* — Amerson Law Firm, PLLC

(57) ABSTRACT

When forming sophisticated semiconductor devices including transistors with sophisticated high-k metal gate electrode structures and a strain-inducing semiconductor alloy, transistor uniformity and performance may be enhanced by providing superior growth conditions during the selective epitaxial growth process. To this end, a semiconductor material may be preserved at the isolation regions in order to avoid the formation of pronounced shoulders. Furthermore, in some illustrative embodiments, additional mechanisms are implemented in order to avoid undue material loss, for instance upon removing a dielectric cap material and the like.

20 Claims, 9 Drawing Sheets

(56) References Cited

U.S. PATENT DOCUMENTS

| | | |
|---|---|---|
| 2009/0032841 A1* | 2/2009 | Eller et al. .................... 257/190 |
| 2009/0174005 A1* | 7/2009 | Pacheco Rotondaro et al. ............................ 257/369 |
| 2010/0164020 A1 | 7/2010 | Kronholz et al. ............. 257/408 |
| 2010/0219474 A1* | 9/2010 | Kronholz et al. ............. 257/347 |
| 2010/0289094 A1* | 11/2010 | Reichel et al. ................ 257/409 |
| 2011/0147853 A1* | 6/2011 | Lin et al. ....................... 257/379 |
| 2011/0269293 A1* | 11/2011 | Kronholz et al. ............. 438/421 |
| 2011/0291163 A1* | 12/2011 | Kronholz et al. ............. 257/288 |
| 2012/0001254 A1* | 1/2012 | Kronholz et al. ............. 257/327 |
| 2012/0025266 A1* | 2/2012 | Griebenow et al. ........... 257/190 |
| 2012/0056245 A1* | 3/2012 | Kang et al. .................... 257/192 |
| 2012/0161238 A1* | 6/2012 | Scheiper et al. .............. 257/368 |
| 2012/0228718 A1* | 9/2012 | Lin et al. ....................... 257/379 |
| 2012/0241868 A1* | 9/2012 | Tsai et al. ...................... 257/369 |
| 2012/0305995 A1* | 12/2012 | Javorka et al. ................ 257/288 |

* cited by examiner

TRANSISTORS WITH EMBEDDED STRAIN-INDUCING MATERIAL FORMED IN CAVITIES PROVIDED BY AN OXIDIZING ETCH PROCESS

BACKGROUND OF THE INVENTION

1. Field of the Invention

Generally, the present disclosure relates to the fabrication of integrated circuits, and, more particularly, to transistors having strained channel regions by using embedded silicon/germanium (Si/Ge) and the like so as to enhance charge carrier mobility in the channel regions of the transistors.

2. Description of the Related Art

The fabrication of complex integrated circuits requires a large number of transistor elements, which represent the dominant circuit element for complex circuits, to be formed in a die region. For example, several hundred million transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies. During the fabrication of complex integrated circuits using CMOS technology, transistors, i.e., N-channel transistors and P-channel transistors, are formed on a substrate including a crystalline semiconductor layer. A MOS transistor or generally a field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions so as to provide low sheet and contact resistivity in combination with desired channel controllability. Moreover, the gate dielectric material may also be adapted to the reduced channel length in order to maintain the required channel controllability. However, some mechanisms for maintaining high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby enabling a performance improvement that is comparable with the advance to a technology standard that would require extremely scaled critical dimensions, while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which, in turn, may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach, since strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium material next to the channel region so as to induce a compressive stress that may result in a corresponding strain. When forming the silicon/germanium material, the drain and source regions of the PMOS transistors are selectively recessed to form cavities, while the NMOS transistors are masked, and subsequently the silicon/germanium material is selectively formed in the cavities of the PMOS transistor by epitaxial growth.

Although the technique has significant advantages in view of performance gain of P-channel transistors and thus of the entire CMOS device, it turns out, however, that, in advanced semiconductor devices including a large number of transistor elements, an increased variability of device performance may be observed, which may be associated with the above-described technique for incorporating a strained silicon/germanium alloy in the drain and source regions of P-channel transistors.

The presence of a strain-inducing silicon/germanium material in the drain and source regions of P-channel transistors may drastically alter the current drive capability of the transistor and, thus, even small variations during the incorporation of the silicon/germanium material or any variations of the material composition may, therefore, significantly affect performance of the P-channel transistors. The strain-inducing effect of the embedded silicon/germanium material depends on the amount of the embedded strain-inducing semiconductor material, the distance with respect to the channel region and also depends on the size and shape of the strain-inducing semiconductor material. For example, incorporating an increased fraction of germanium may result in an increase of the resulting strain, since the corresponding lattice mismatch between the silicon/germanium material and the silicon material of the active region may be increased. The maximum concentration of germanium in the semiconductor alloy, however, may depend on the process strategy used, since further increasing the germanium concentration may result in undue germanium agglomeration, which in turn may provide increased lattice defects and the like. Furthermore, the amount of the strain-inducing material and the shape thereof in the drain and source regions may depend on the size and shape of the cavities formed in the drain and source areas, wherein also the effective distance from the channel region may be substantially determined on the basis of the size and shape of the corresponding cavities.

A typical conventional process flow for forming an embedded silicon/germanium material in P-channel transistors may include the following process steps. After forming the active semiconductor regions, which is typically accomplished by forming appropriate isolation regions that laterally delineate the active regions, the electrode structures are formed on the basis of any appropriate process strategy. That is, appropriate materials, such as dielectric materials, electrode materials and the like, are provided in combination with one or more appropriate dielectric cap materials which may be used, in addition to its use in the actual patterning of the gate layer stack, as an etch and deposition mask in a later manufacturing stage when the embedded strain-inducing silicon/germanium material is deposited. In sophisticated applications, the gate electrode structures of field effect transistors are provided with a gate length of 50 nm and less thereby providing superior transistor performance, for instance in terms of switching speed and drive current capability. The reduced critical dimensions, however, may also contribute to a pronounced dependency of the resulting transistor performance on process variations, in particular when any such process variations may occur upon implementing a very efficient performance enhancing mechanism, such as embedding the strain-inducing silicon/germanium material in P-channel transistors. For example, a variation of the lateral distance of the silicon/germanium material with respect to the channel region may over-proportionally influence the finally obtained performance, in particular when basically extremely scaled transistors are considered.

Based on the dielectric cap material and the sidewall spacer structure, cavities may then be etched in to the drain and source areas, wherein the size and shape may be substantially determined on the basis of the etch parameters of the corresponding etch process. It should be appreciated that any other transistors, such as N-channel transistors, in which the incorporation of a silicon/germanium material is not required, are covered by an appropriate mask layer. After any appropriate cleaning processes for preparing exposed surface areas of the silicon material in the drain and source areas, a selective epitaxial growth process may be performed, in which the silicon/germanium material may be selectively deposited on exposed silicon surface areas while a significant deposition of the semiconductor material on dielectric surface areas, such as dielectric cap materials, sidewall spacers, isolation regions and mask layers, may be suppressed.

As discussed above, the final gain in performance of the P-channel transistor transistors may depend critically on the amount of strained semiconductor material and its offset from the channel region. Consequently, great efforts have been made in developing a process strategy in which a plurality of complex processes may be performed on the basis of a degree of process uniformity across the individual semiconductor die regions and also across entire substrates to reduce any variability of the transistor characteristics.

It is well known that a plurality of processes, such as plasma assisted etch processes, deposition processes and the like, may be influenced by the local configuration of the substrate surface to be treated. That is, the etch rate in plasma assisted etch processes may be influenced by the "pattern" density, i.e., by the ratio of surface area to be etched with respect to the surface area of substantially resistive materials. For example, when a large number of densely packed active areas may have to be provided with corresponding cavities, the resulting etch rate in this device area may differ from an etch rate in an area in which a moderate number of more or less isolated active regions may have to be etched. The corresponding effect is also known as "pattern loading." Similarly, the deposition rate may vary to a certain degree depending on the local pattern density, wherein, for instance, in selective epitaxial growth recipes for forming silicon/germanium, an increased fill behavior in densely packed device areas may be observed compared to more or less isolated device regions, while in other cases the opposite deposition behavior may occur.

Consequently, it is very difficult to adjust the process parameters of the selective epitaxial growth process in such a manner that a substantially uniform fill height of the silicon/germanium alloy is accomplished across the entire die region. Moreover, upon attempting to achieve a substantially uniform fill height across the substrate, nevertheless the local fill conditions may be different within individual active regions, for instance when filling a cavity that is adjacent to an isolation region, since typically the material deposition on dielectric surface areas is significantly restricted during the selective epitaxial growth process. Thereafter, different fill behaviors may be observed in a highly local manner, for instance by achieving a substantially bottom-to-top fill behavior, while in other cases pronounced facets may be achieved at an interface between a dielectric material and the selectively grown silicon/germanium alloy. Therefore, a plurality of process-related non-uniformities may be introduced, which may finally result in a pronounced transistor variability, in particular when highly scaled sophisticated high-k metal gate electrode structures are considered. As discussed above, although the fabrication of the sophisticated high-k metal gate electrode structures in an early manufacturing phase may provide substantial advantages compared to a replacement gate approach, the complex interaction of the various process-related non-uniformities may finally result in severe device failures, as will be explained in more detail with reference to FIGS. 1a-1g.

FIG. 1a schematically illustrates a cross-sectional view of a semiconductor device 100 in a manufacturing stage in which complex high-k metal gate electrode structures 160A, 160B, 160C may be provided with lateral dimensions of, for instance, 50 nm and less. In this manufacturing stage, the device 100 typically comprises a substrate 101 in combination with a semiconductor layer 102, such as a silicon layer, in which a plurality of active regions are provided, wherein, for convenience, a first active region 102A, representing the active region of P-channel transistors, and a second active region 102C are illustrated. Generally, an active region is to be understood as a semiconductor region of the layer 102 in and above which one or more transistors have to be formed. The active regions 102A, 102C are laterally delineated by an appropriately dimensioned and shaped isolation structure 102B, for instance, provided in the form of a shallow trench isolation. As shown, the gate electrode structures 160A, 160B may represent gate electrode structures of P-channel transistors to be formed in and above the active region 102A, while the gate electrode structure 160C represents the gate electrode structure of an N-channel transistor to be formed in and above the active region 102C. In the manufacturing stage shown, the gate electrode structures 160A, 160B, 160C comprise a gate dielectric material 161, which may have incorporated therein a gate dielectric material so as to provide a total dielectric constant that is 10.0 and higher, which may be accomplished on the basis of materials such as hafnium oxide, zirconium oxide and the like, which are generally referred to hereinafter as high-k dielectric materials. Furthermore, a metal-containing electrode material 162, such as titanium nitride and the like, is typically provided in combination with the dielectric material 161 in order to obtain the required threshold voltage characteristics and the like. It should be noted, however, that the materials 161, 162 in the gate electrode structures 160A, 160B on the one hand, and in the gate electrode structure 160C on the other hand, may differ in their material composition, for instance with respect to a work function metal species since typically different work functions are required for the gate electrode structures of different transistors. Furthermore, a silicon-based electrode material 163 is provided in combination with a dielectric cap layer or cap layer system 164, for instance comprising silicon nitride, silicon dioxide and the like. Furthermore, a spacer structure 165, for instance comprised of one or more silicon nitride layers and the like, are formed on sidewalls of the electrode material 163 and the sensitive materials 162, 161 in the gate electrode structures 160A, 160B, while a spacer layer 165S is provided so as to cover the second active region 102C and the gate electrode structure 160C. Additionally, an etch mask 103, such as a resist mask, is formed above the second active region 102C.

The device 100 as shown in FIG. 1a may be formed on the basis of the following process strategy. The isolation structure 102B is formed by applying sophisticated lithography, etch, deposition, anneal and planarization techniques in order to form trenches and fill the trenches with an appropriate dielectric material, thereby also defining the lateral size and shape of the active regions 102A, 102C. After incorporating any dopant species in accordance with the overall device requirements, the gate electrode structures 160A, 160B, 160C are formed, which may require complex deposition and patterning processes in order to provide the materials 161, 162 for the various transistor types. That is, since typically different work function metal species have to be provided for different transistor types, a corresponding deposition, masking and patterning regime is applied in this manufacturing stage, possibly followed by any thermal treatments in order to provide the materials 161 and 162 with the required characteristics. Thereafter, the electrode material 163 in combination with the cap material or materials 164 are deposited and subsequently patterned by using sophisticated lithography and etch strategies, thereby finally obtaining the gate electrode structures 160A, 160B, 160C with the desired critical dimensions, i.e., with a gate length 160L of 50 nm and significantly less in sophisticated applications. Next, the spacer layer 165S is deposited, which may include one or more deposition processes, such as a multi-layer deposition, possibly in combination with a low pressure chemical vapor deposition (CVD) process, followed by the patterning of the etch mask 103, which may then be used for etching the spacer layer 165S in order to obtain the spacer elements 165 in the gate electrode structures 160A, 160B. It should be appreciated that the spacer structures 165 are used for confining the sensitive gate materials and may also act as offset spacer elements during the further processing for forming cavities in the active region 102A and for appropriately defining the lateral and vertical dopant profiles in the active regions 102A, 102C in a further advanced manufacturing stage. Due to the patterning process of the spacer layer 165S, generally a certain degree of material erosion may occur in exposed portions of the isolation structure 102B and the exposed cap layers 164, as well as in the active region 102A, as indicated by the dashed line.

FIG. 1b schematically illustrates the device 100 in an advanced manufacturing stage in which cavities 104 are formed in the active region 102A, which is typically accomplished by applying an anisotropic plasma assisted etch process, which, in some illustrative embodiments, is performed as an in situ process upon patterning the spacer layer 165S. Due to the anisotropic nature of the etch process, the resulting cavities 104 are substantially U-shaped, wherein the depth of the cavity strongly depends on the process parameters of the corresponding plasma assisted etch process. After the etch process, the mask 103 (FIG. 1a) may be removed, thereby exposing the spacer layer 165S. Thereafter, the device 100 is prepared for the subsequent selective deposition of a silicon/germanium alloy in the cavities 104, which may involve a plurality of cleaning recipes and the like.

FIG. 1c schematically illustrates the device 100 in a further advanced stage in which a silicon/germanium material 105 is selectively grown in the cavities 104, while the spacer layer 165S may be used as a deposition mask above the active region 102C. As explained above, a selective epitaxial growth process may, in addition to the pattern loading effects discussed above, suffer from a very local deposition related non-uniformity, for instance at sidewall surfaces 102S of the isolation structure 102B. Frequently, a facet-like configuration is obtained during the growth of the material 105, thereby creating respective "shoulders" 105S at the edge of the peripheral cavities 104, while in the central cavity a substantially uniform growth of the material 105 is observed.

After the growth of the material 105, the spacer layer 165S may be patterned into the spacer structure 165 in the gate electrode structure 160C, wherein the active region 102A may be covered by a resist mask (not shown), while in other cases a corresponding material erosion in the cap layers 164 of the gate electrode structures 160A, 160B and also in the silicon/germanium alloy 105 may be observed.

FIG. 1d schematically illustrates the device 100 in a further advanced manufacturing stage in which a process strategy is applied that requires the subsequent removal of the cap layers 164 while preserving the spacer structure 165 so as to ensure integrity of the sensitive gate materials and also enable the usage of the spacer structure 165 as an offset spacer structure during the further processing, for instance when incorporating drain and source dopant species. In order to substantially preserve the spacer structure 165, sacrificial spacer elements 106, for instance comprised of silicon dioxide, are formed, which is accomplished by depositing an appropriate oxide material and patterning the same on the basis of a plasma assisted etch process. Consequently, during the corresponding etch process, an additional erosion of the material 105 is observed, as indicated by 105E, while also a certain material loss in the isolation structure 102B may be observed.

FIG. 1e schematically illustrates the device 100 after performing a further etch process, for instance on the basis of appropriate wet chemical etch recipes, such as hot phosphoric acid and the like so as to remove the dielectric cap layers 164 (FIG. 1d), thereby exposing the silicon-based electrode material 163 in the gate electrode structures 160A, 160B, 160C. During the corresponding etch process, however, a further erosion, in particular of the material 105, may be observed so that, in total, up to one third of the initially deposited silicon/germanium alloy may be lost. In particular, the pronounced shoulders 105S may have a significant influence on the finally obtained transistor characteristics and also on increased yield losses in a later manufacturing stage.

FIG. 1f schematically illustrates the device 100 in a further advanced manufacturing stage. As shown, transistors 150A, 150B are formed in and above the active region 102A on the basis of the gate electrode structures 160A, 160B. Similarly, a transistor 150C is formed in and above the active region 102C and comprises the gate electrode structure 160C. The transistors 150A, 150B are P-channel transistors and thus the performance thereof significantly depends on the strain-inducing effect within a channel region 152 induced by the previously grown semiconductor material 105. Thus, due to the pronounced shoulders 105S and due to the pronounced material loss of the material 105 during the further processing, as explained above, the finally achieved strain in the channel regions 152 of the transistors 150A, 150B may generally be reduced and may also be highly non-uniform, for instance with respect to the difference of the material 105 formed immediately adjacent to isolation regions 202B compared to the material 105 formed in a central area of the active region 102A. For example, if more than two transistors are formed in the active region 102A, central transistors may have very different performance characteristics compared to any "edge" transistors, which are provided adjacent to an isolation region.

Furthermore, the transistors 150A, 150B and 150C comprise drain and source regions 151 having any appropriate lateral and vertical dopant profile, wherein it should be appreciated that the drain and source regions 151 in the active region 102A are of inverse conductivity type compared to the drain and source regions 151 in the active region 102C. The dopant profile of the drain and source regions 151 may be adjusted on the basis of a spacer structure 167, possibly in combination with the spacer structure 165, wherein also the pronounced shoulders 105S may contribute to process non-uniformities upon forming the spacer structure 167 due to a significant difference between central areas and peripheral areas of the active region 102A.

Furthermore, metal silicide regions 156 may be provided in the drain and source regions, wherein, due to the disadvantageous shape and configuration of the shoulders 105S, generally a reduced thickness of the metal silicide 156 in these areas is observed compared to the central metal silicide 156 and compared to the metal silicide 156 in the transistor 150C. The non-uniformity in thickness of the metal silicide material in the drain and source regions 151 of the transistors 150A, 150B may have a remarkable influence on device failures upon forming contact elements in a later manufacturing stage. Furthermore, metal silicide material 166 may be formed in the gate electrode structures 160A, 160B, 160C, thereby also providing superior conductivity of the gate electrode structures.

The transistors 150A, 150B, 150C may be formed on the basis of any appropriate process strategy for incorporating the drain and source dopant species and forming the spacer structure 167, wherein, as discussed above, the pronounced surface non-uniformity of the shoulders 105S may result in a non-uniform spacer width, which in turn may cause non-uniformities in the drain and source regions of "edge" transistors compared to central transistors. After any anneal processes, the metal silicide materials 156, 166 are formed, for instance, by using well-established process strategies for depositing one or more desired refractory metals, such as nickel, platinum and the like, and initiating a chemical reaction, wherein the metal silicide thickness at the shoulders 105S may be reduced.

FIG. 1g schematically illustrates the device 100 in a further advanced manufacturing stage in which a contact level 120 is formed so as to enclose and passivate the transistors 150A, 150B, 150C. The contact level 120 may comprise the first dielectric material 121, such as a silicon nitride material, followed by a second dielectric material 122, such as a silicon dioxide material and the like. To this end, any well-established deposition recipes are typically applied. After planarizing the dielectric materials, sophisticated patterning regimes are applied in order to form openings 123 in the dielectric materials 122, 121, wherein, in a final etch step, typically the metal silicide 156 in the drain and source regions 151 is used as an etch stop material. Due to the reduced thickness in the "edge" transistors caused by the shoulders 105S, the etch stop capabilities may be significantly reduced so that the etch process may etch through the metal silicide material 156 and deeply into the active region 102A which, upon filling the contact openings 123 with a conductive material, may result in a short-circuiting of the drain and source regions 151, thereby at least significantly altering the transistor characteristics or even contributing to a total device failure.

Consequently, the plurality of complex process steps involved in providing a strain-inducing semiconductor alloy in sophisticated transistors may thus result in pronounced transistor variability and significant yield losses.

In view of the situation described above, the present disclosure relates to manufacturing techniques and semiconductor devices in which a strain-inducing semiconductor alloy may be incorporated into the active region, in particular for transistors comprising sophisticated high-k metal gate electrode structures, while avoiding, or at least reducing, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques and semiconductor devices in which superior transistor uniformity may be achieved by improving the conditions, in particular, during the critical deposition of a strain-inducing semiconductor alloy, which may be accomplished by specifically controlling the sidewall inclination of the cavities to be formed prior to depositing the strain-inducing semiconductor alloy. In further illustrative aspects disclosed herein, in addition to enhancing the deposition uniformity during the selective epitaxial growth process, further strategies may be applied so as to obtain a synergetic effect with respect to superior transistor uniformity and in view of a significant reduction of yield losses, thereby enabling a scaling of complex semiconductor devices comprising high-k metal gate electrode structures formed in an early manufacturing stage.

One illustrative method disclosed herein comprises forming a gate electrode structure of a transistor above an active region that is laterally delineated by an isolation region, wherein the active region comprises a semiconductor base material. The method further comprises forming a cavity in the active region between the gate electrode structure and the isolation region and preserving a portion of the semiconductor base material adjacent to the isolation region so as to laterally delimit the cavity from the isolation region. The method further comprises forming a strain-inducing semiconductor alloy in the cavity by using the preserved portion as a seed material. Moreover, drain and source regions of the transistor are formed in the active region.

A further illustrative method disclosed herein relates to forming a transistor in a semiconductor device. The method comprises forming a plurality of gate electrode structures above an active region which comprises a semiconductor material and which is laterally delineated by an isolation region. The method further comprises performing a plasma assisted etch process so as to form cavities in the active region, wherein the cavities are laterally delineated by the semiconductor material. The method further comprises forming a strain-inducing semiconductor alloy in the cavities and forming drain and source regions in the active region.

One illustrative semiconductor device disclosed herein comprises a gate electrode structure formed above an active region that is laterally delineated by an isolation region, wherein the gate electrode structure comprises a high-k dielectric material, a metal-containing electrode material formed above the high-k dielectric material, a silicon-containing semiconductor material and a metal silicide. The semiconductor device further comprises a strain-inducing semiconductor alloy formed in the active region and having a substantially uniformly inclined sidewall adjacent to the isolation region.

BRIEF DESCRIPTION OF THE DRAWINGS

The disclosure may be understood by reference to the following description taken in conjunction with the accompanying drawings, in which like reference numerals identify like elements, and in which.

Figure 1A:
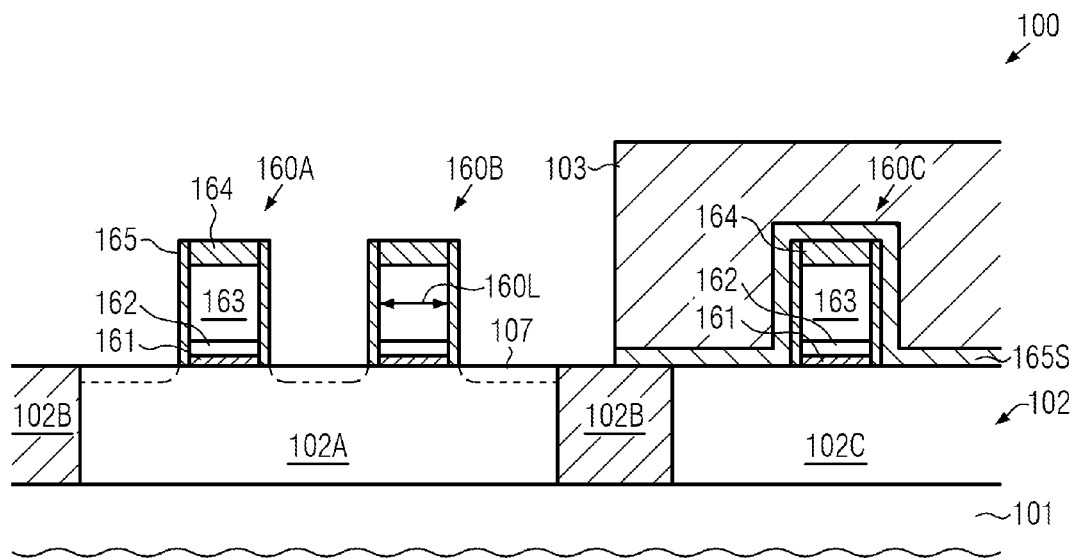
FIGS. 1a-1g schematically illustrate cross-sectional views of a complex semiconductor device during various manufacturing stages in forming a strain-inducing semiconductor alloy in P-channel transistors according to a complex conventional process strategy.
Figure 1B:
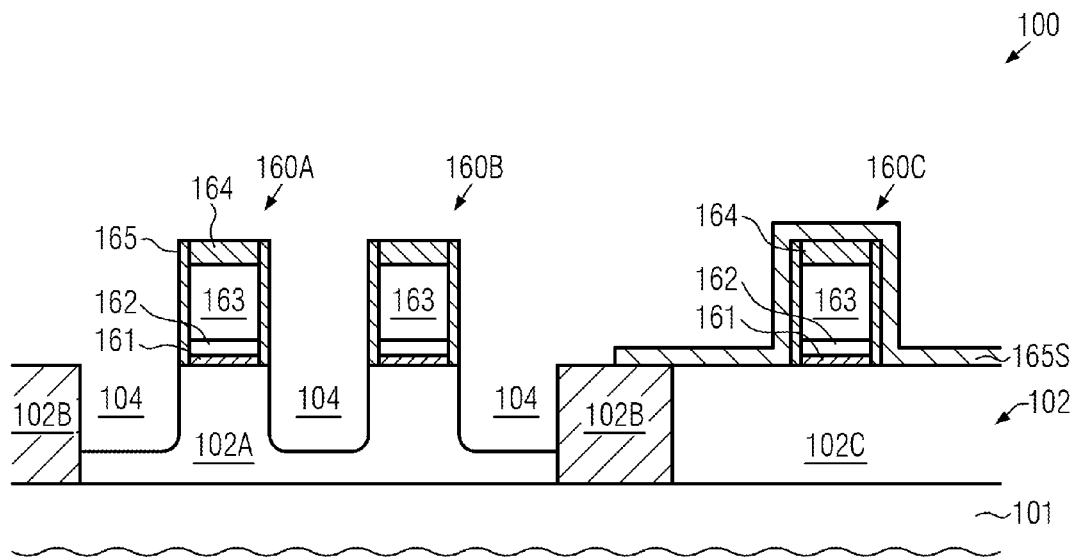
Figure 1C:
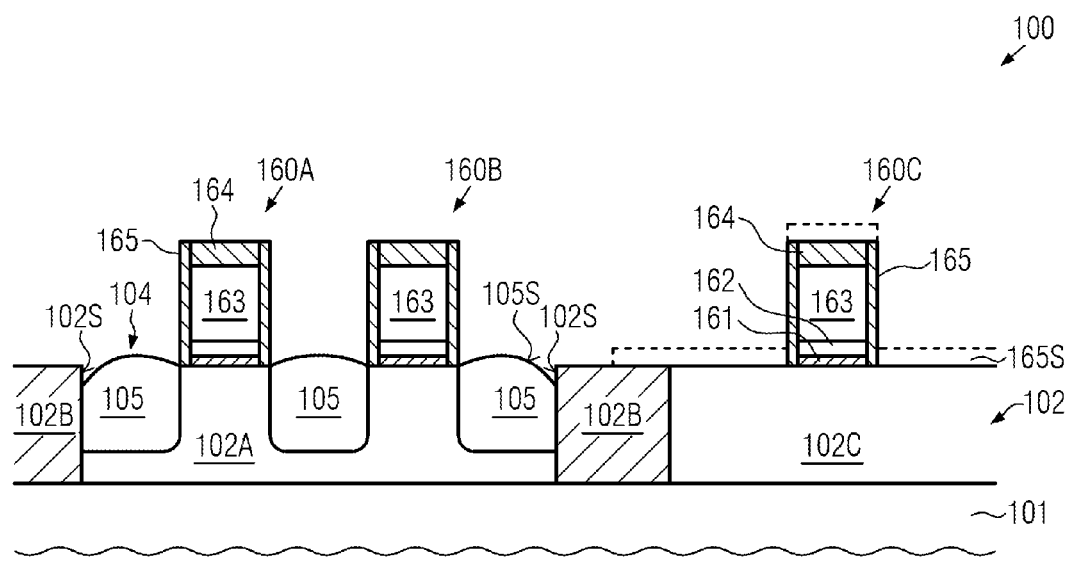
Figure 1D:
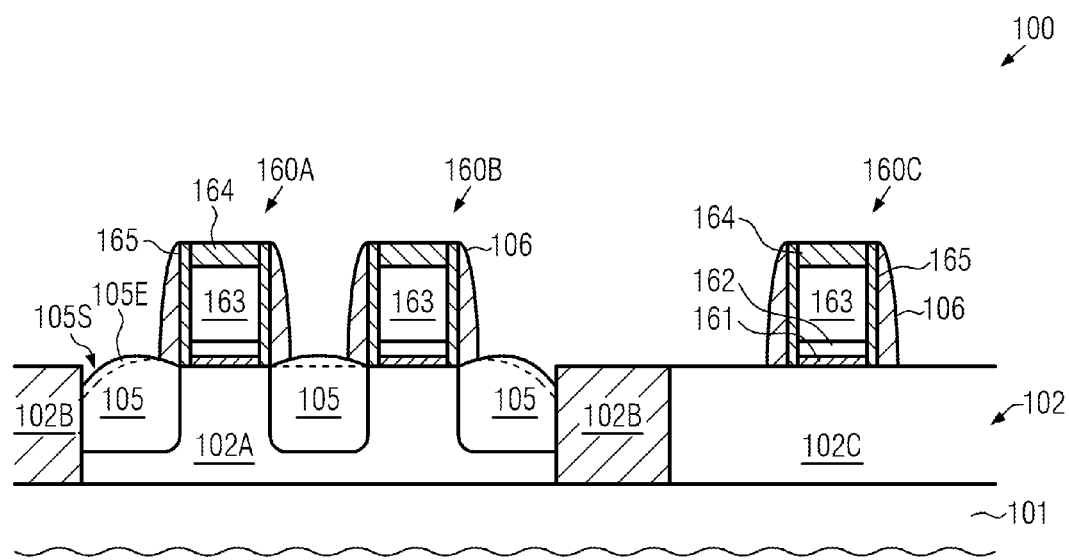
Figure 1E:
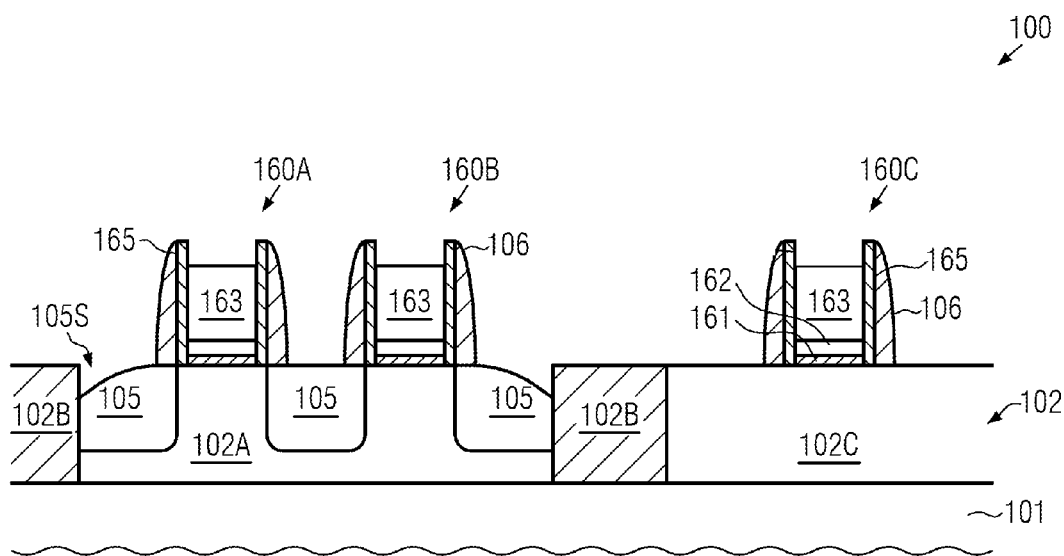
Figure 1F:
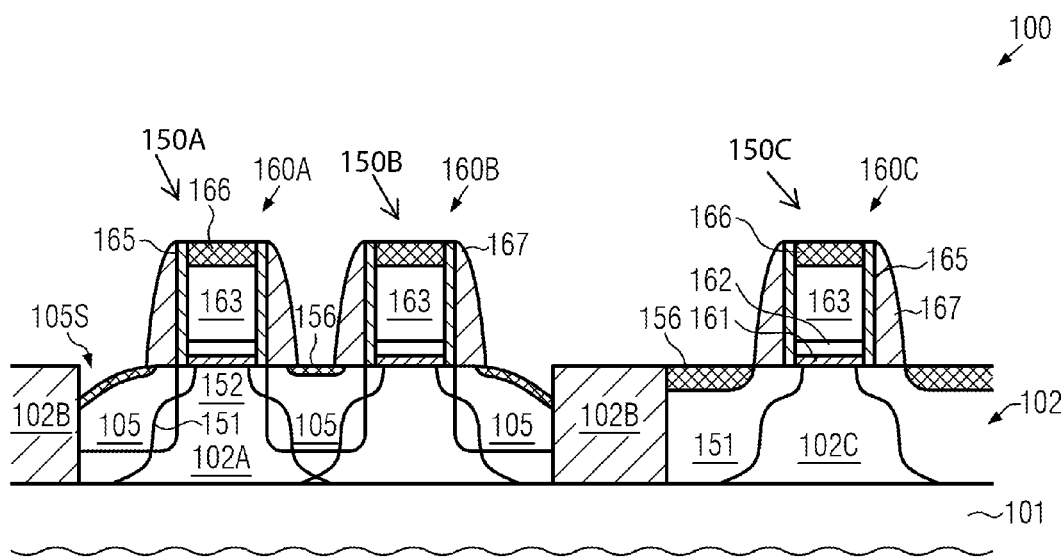
Figure 1G:
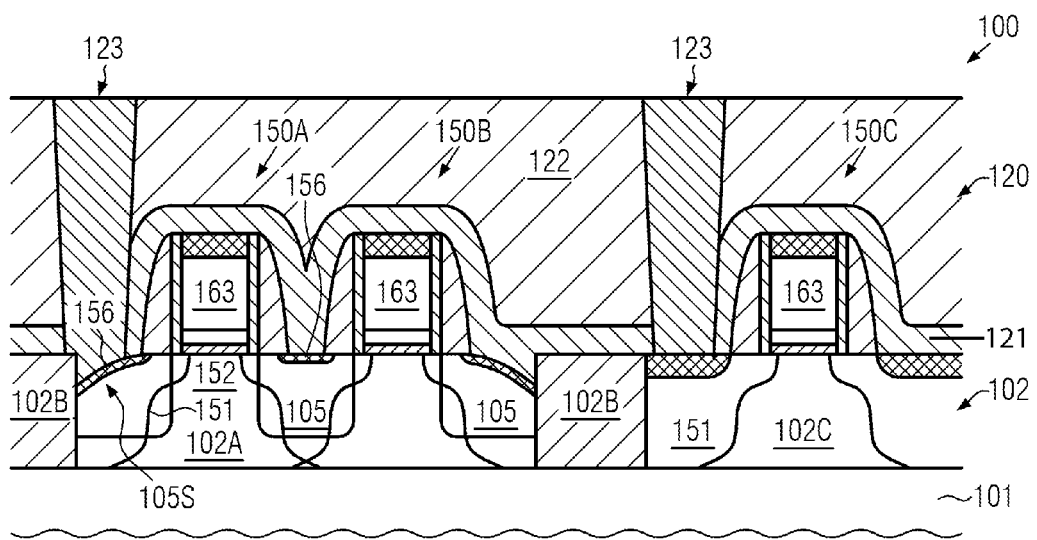

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure contemplates manufacturing techniques and semiconductor devices in which superior process robustness in combination with enhanced uniformity of transistor characteristics may be obtained on the basis of an embedded strain-inducing semiconductor material during a process sequence in which sophisticated high-k metal gate electrode structures are formed in an early manufacturing stage. To this end, in some illustrative embodiments, the growth conditions during the selective epitaxial growth process are enhanced by forming the corresponding cavity on the basis of a plasma assisted etch process such that a semiconductor material is preserved at the periphery of the active region so as to avoid a direct contact of the growing semiconductor alloy and the dielectric material of the sidewalls of the adjacent isolation regions. In this manner, substantially the same growth conditions in central areas of the active region compared to the peripheral or edge regions are achieved, thereby obtaining a high degree of uniformity for otherwise given process parameters of the selective epitaxial growth process. To this end, in some illustrative embodiments, the plasma assisted etch process is performed in an etch atmosphere to which additionally an oxidizing species, such as oxygen gas, is supplied so as to initiate a certain degree of oxidation of sidewall surface areas of the cavities that is being etched, thereby obtaining a certain degree of passivation of the sidewall surface areas. In this manner, a substantially V-shaped configuration may be achieved, thereby reliably preserving a desired portion of semiconductor material that separates the cavities from adjacent isolation regions.

Furthermore, additional measures may be taken so as to further enhance overall uniformity of the resulting strain-inducing mechanism wherein, in particular, the overall material loss may be significantly reduced compared to conventional strategies, thereby not only providing superior uniformity, but also generally increasing the efficiency of the strain-inducing mechanism without requiring an increased size of the cavities and/or requiring different process parameters or a different geometry, i.e., increased fill height of the initially provided strain-inducing semiconductor alloy. Furthermore, due to the superior uniformity and due to the generally reduced loss of the strain-inducing semiconductor material, also superior conditions are achieved to form contact elements, thereby significantly reducing the probability of etching through a metal silicide when forming contact openings that connect to the edge of active regions of P-channel transistors.

With reference to FIGS. 2a-2i, further illustrative embodiments will now be described in more detail, wherein reference may also be made to FIGS. 1a-1g, if appropriate.

Figure 2A:
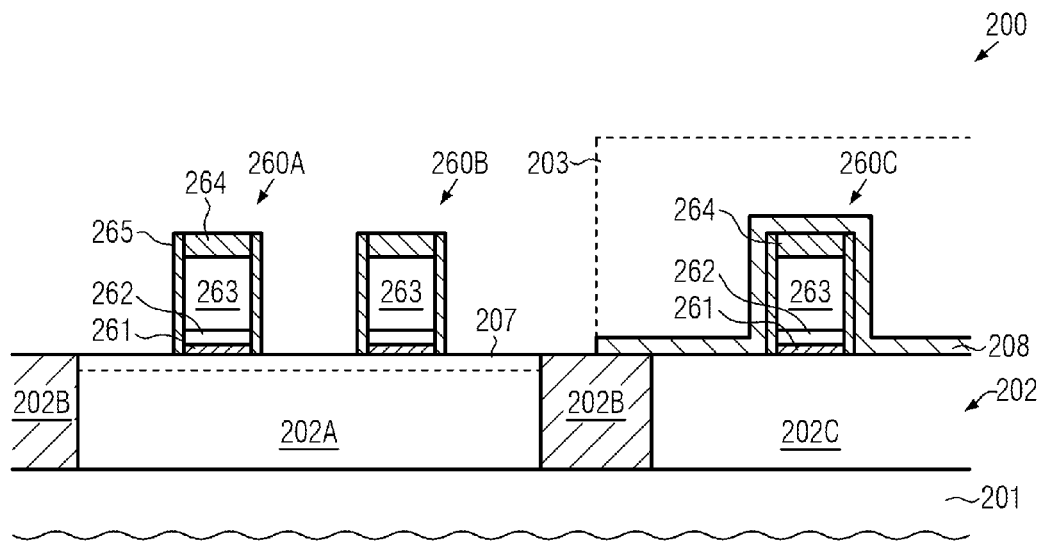
FIGS. 2a-2i schematically illustrate cross-sectional views of a semiconductor device during various manufacturing stages when forming a strain-inducing semiconductor alloy with superior uniformity, wherein, in some illustrative embodiments, additional measures may be taken so as to further enhance transistor uniformity and reduce yield losses.

FIG. 2a schematically illustrates a cross-sectional view of a semiconductor device 200 comprising a substrate 201 and a semiconductor layer 202, such as a silicon-based layer, or any other appropriate semiconductor material, which may comprise a significant portion of silicon. The semiconductor layer 202 may be formed so as to directly connect to a crystalline semiconductor material of the substrate 201 if a bulk architecture is considered, as shown in FIG. 2a, while, in other cases, a silicon-on-insulator (SOI) architecture may be provided when a buried insulating material (not shown) is formed below the semiconductor layer 202. The layer 202 may be a continuous semiconductor material in an initial state and may be divided into a plurality of active regions, such as active regions 202A, 202C, by providing appropriate isolation structures 202B.

Generally, the isolation region 202B and the active regions 202A, 202C may have similar characteristics as already discussed above with reference to the device 100. Thus, with respect to these components and manufacturing techniques for forming the same, the same criteria may apply as discussed above.

Moreover, in this manufacturing stage, gate electrode structures 260A, 260B may be formed on the active region 202A, which in some cases may comprise an additional semiconductor material 207 having appropriate electronic characteristics in order to adjust the overall threshold characteristics of transistors still to be formed in and above the active region 202A. In this case, the material 207, for instance provided in the form of a silicon/germanium alloy, may be a part of the active region 202A whose semiconductor base material may have a different material composition compared to the threshold voltage adjusting material 207. On the other hand, a gate electrode structure 260C may be formed above the active region 202C wherein a corresponding threshold voltage adjusting semiconductor material may be omitted if a transistor of different conductivity type or generally of different threshold voltage characteristics is to be formed in and above the active region 202C. It should be appreciated, however, that the layer 207 may also be omitted in the active region 202A, depending on the type of transistors to be formed therein. The gate electrode structures 260A, 260B, 260C may have any appropriate configuration and may comprise a gate dielectric material 261, which may comprise a high-k dielectric component, followed by a metal-containing electrode material 262 and a silicon-containing semiconductor material 263, followed by a dielectric cap layer or cap layer system 264, as is for instance also described above with reference to the device 100. In some illustrative embodiments, a spacer structure 265 may be formed on the gate electrode structures 260A, 260B and also in the gate electrode structure 260C, thereby providing a very similar and uniform device configuration in this manufacturing stage. In this case, an additional mask layer 208, such as a silicon dioxide layer and the like, may be formed so as to cover the second active region 202C and the gate electrode structure 260C. Furthermore, an etch mask, such as a resist mask 203, may be provided so as to cover the second active region 202C.

With respect to forming the gate electrode structures 260A, 260B, 260C, the same criteria may apply as previously discussed. In the case of the semiconductor layer 207 having to be provided, an appropriate process sequence may be implemented prior to forming the gate electrode structures, for instance by masking the active region 202C using any appropriate hard mask material, such as silicon dioxide, silicon nitride and the like, and selectively growing a desired semiconductor alloy on the base material of the active region 202A, i.e., on the semiconductor material of the initial semiconductor layer 202. Thereafter, the gate electrode structures 260A, 260B, 260C may be formed, for instance, as described above, wherein finally the spacer structure 265 may be formed by depositing one or more material layers such as silicon nitride layers and patterning the same in a non-masked etch process, thereby concurrently forming the spacer structure 265 for any of the gate electrode structures 260A, 260B, 260C. In this case, the gate electrode structures 260A, 260B on the one hand and the gate electrode structure 260C as well as the corresponding active regions 202A, 202C and the adjacent isolation regions 202B may experience the same process history, thereby enhancing overall process uniformity. Thereafter, the mask layer 208 may be formed, for instance, by providing a silicon dioxide material with appropriate thickness and patterning the material 208 by using the mask 203, wherein generally highly selective etch recipes and the generally reduced thickness of the layer 208 may not unduly affect the gate electrode structures 260A, 260B and exposed portions of the isolation region 202B.

Figure 2B:
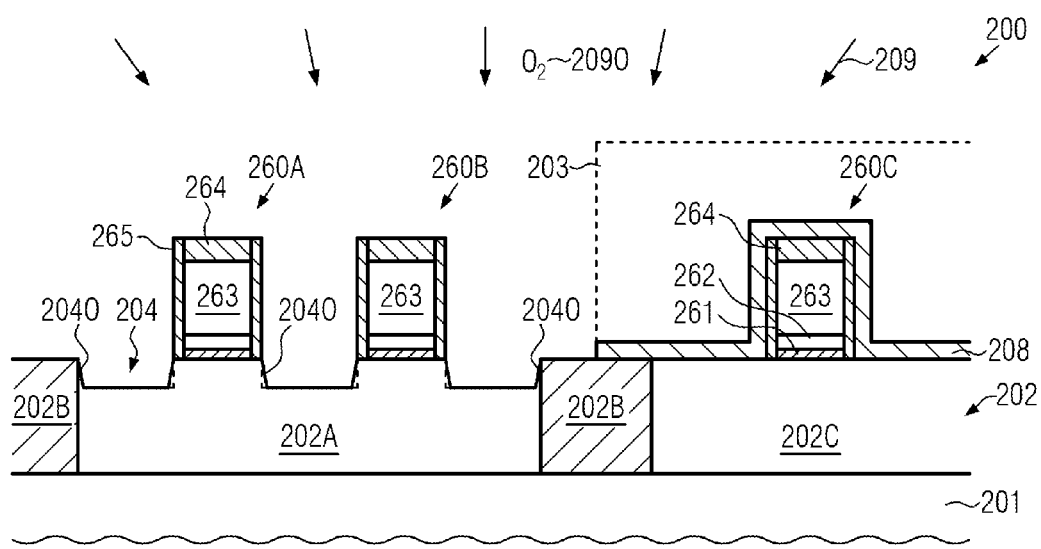

FIG. 2b schematically illustrates the device 200 in a further advanced process stage in which a plasma assisted etch atmosphere 209 is established, which may be accomplished on the basis of well-established process recipes, for instance in the presence of the mask 203 or after removal of the mask 203. Contrary to conventional process recipes, however, an additional oxidizing species, for instance in the form of oxygen gas 209O, is incorporated into the atmosphere 209, thereby forming an oxide material 204O on exposed sidewall surface areas of cavities 204, which are continuously being formed during exposure to the ambient 209 including the oxidizing species 209O. Hence, upon etching into the depth of the active region 202A, thereby increasingly removing the semiconductor base material, the oxide material 204O may preferably passivate the sidewalls so that a substantially tapered cross-sectional shape of the cavities 204 may be obtained.

Figure 2C:
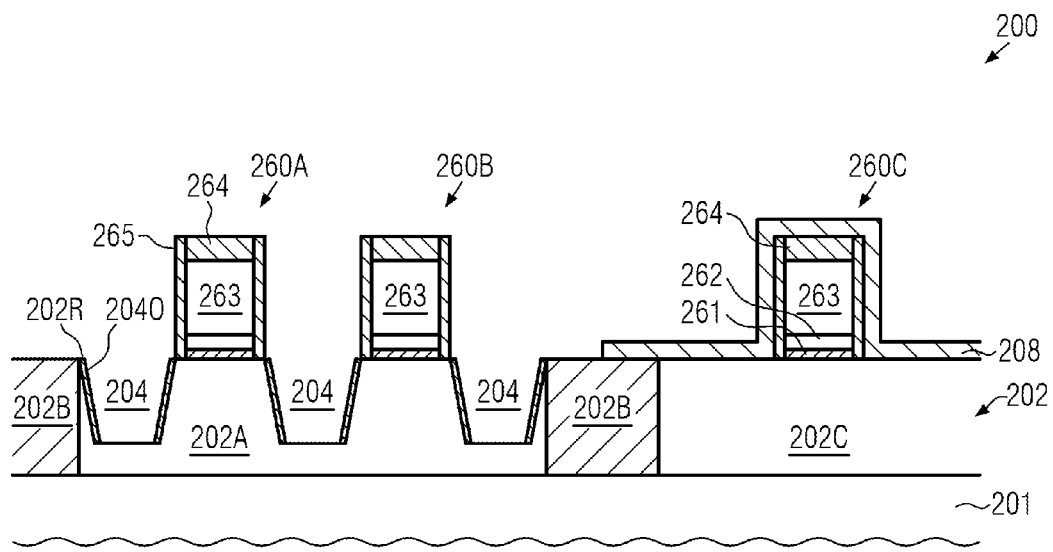

FIG. 2c schematically illustrates the device 200 after the plasma assisted etch process 209 (FIG. 2b) wherein the cavities 204 extend to a desired depth in the base material of the active region 202A, thereby obtaining a substantially V-shaped cross-sectional configuration of the cavities 204. That is, the sidewall surface areas 204O comprised of oxide material are substantially uniformly inclined and therefore preserve a portion 202R of the base material of the active region 202A adjacent to the isolation region 202B. Consequently, the remaining base material 202R, possibly in combination with a thin layer of a threshold adjusting semiconductor material (FIG. 2a), may separate the cavities 204 from the isolation region 202B. It should be appreciated that the degree of inclination of the sidewall surface areas 204O comprised of the oxidized base material may be efficiently controlled by selecting appropriate process parameters, such as the gas flow rate of the oxidizing species for otherwise given process parameters, wherein any appropriate set of parameter values may be readily determined by performing tests with varying parameter settings and monitoring the resulting cross-sectional shape of the cavities 204 for various test devices.

Figure 2D:
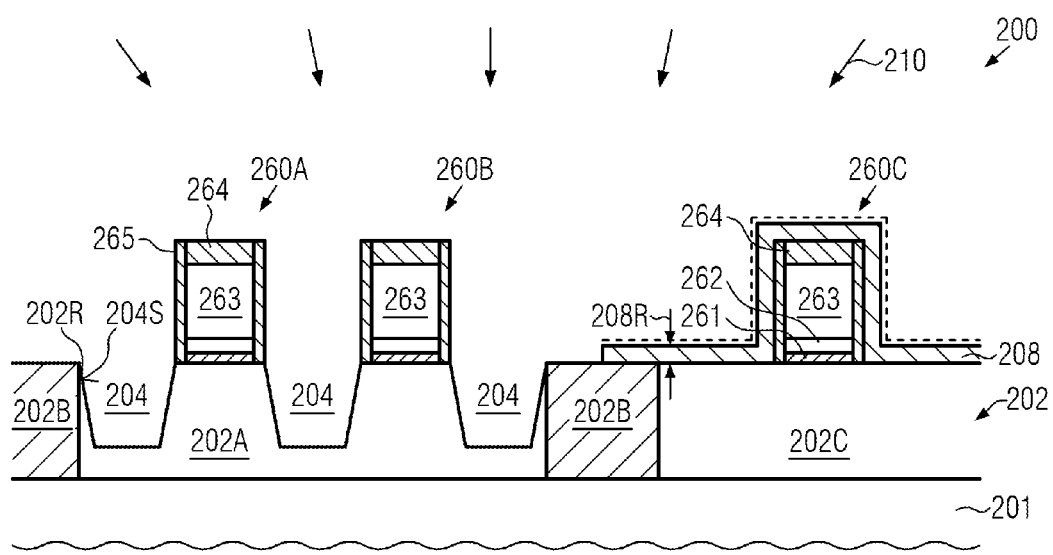

FIG. 2d schematically illustrates the semiconductor device 200 when exposed to a further reactive atmosphere in the form of a cleaning process or etch process 210 in order to prepare the device 200 for a subsequent selective epitaxial growth process. During the process 210, any oxide residues may be removed, thereby forming the inclined sidewall surface areas 204S of the cavities 204 in a substantially oxide-free state, while also a certain material loss may occur in the mask layer 208 which, however, may nevertheless provide a sufficient thickness 208R in order to act as a deposition mask during the further processing of the device 200. Consequently, after the process 210, the remaining base material 202R still reliably separates the cavities 204 at the periphery of the active region 202A from the isolation region 202B, thereby providing surface conditions within the cavities 204 that are substantially identical for any of the cavities 204, irrespective of the position thereof within the active region 202A.

Figure 2E:
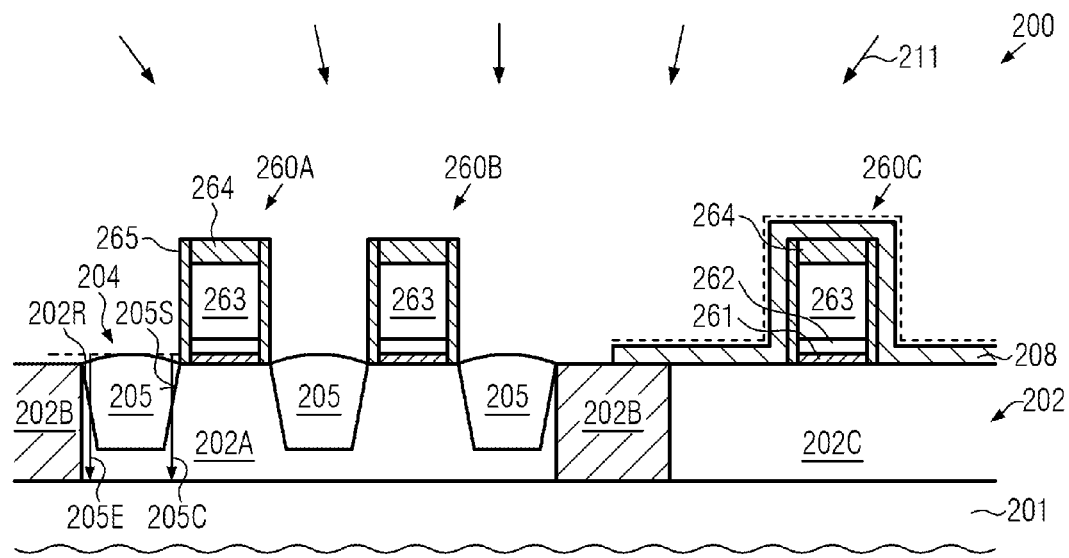

FIG. 2e schematically illustrates the device 200 during a selective epitaxial growth process 211 in which, as discussed above, process parameters are typically adjusted such that material deposition is restricted to crystalline surface areas, while a deposition of material on dielectric surface areas is substantially suppressed. Thus, for given process parameters of the selective deposition process 211, a similar growth rate may be obtained in any of the cavities 204 since every cavity 204 within the active region 202A is delimited by semiconductor material, thereby providing substantially the same growth conditions at the edge and the center of the active region 202A. Consequently, a growth height of a strain-inducing semiconductor material 205, for instance provided in the form of a silicon/germanium alloy and the like, near the isolation region 202B, as indicated by 205E, may be substantially equal to a growth height adjacent to the gate electrode structures 260A, 260B, as indicated by 205C. In this respect, the term "approximately the same" in view of the growth heights 205E, 205C is to be understood that these heights differ from each other by less than 10% with respect to the greater one of the growth heights. Moreover, during the selective epitaxial growth process 211, the mask layer 208 may act as a reliable growth mask, thereby avoiding the deposition of the material 205 on the active region 202C.

Consequently, the further processing of the device 200 may be continued on the basis of a tapered strain-inducing semiconductor material 205 having uniformly inclined sidewall areas 205S which are separated from the isolation region 202B by the remaining base material 202R, as previously explained. Generally, in some illustrative embodiments, the further processing may be continued by removing the mask layer 208 and removing the cap layers 264 of the gate electrode structures 260A, 260B, 260C in an appropriate etch sequence, followed by the formation of drain and source regions, as is similarly described above with reference to the semiconductor device 100.

Figure 2F:
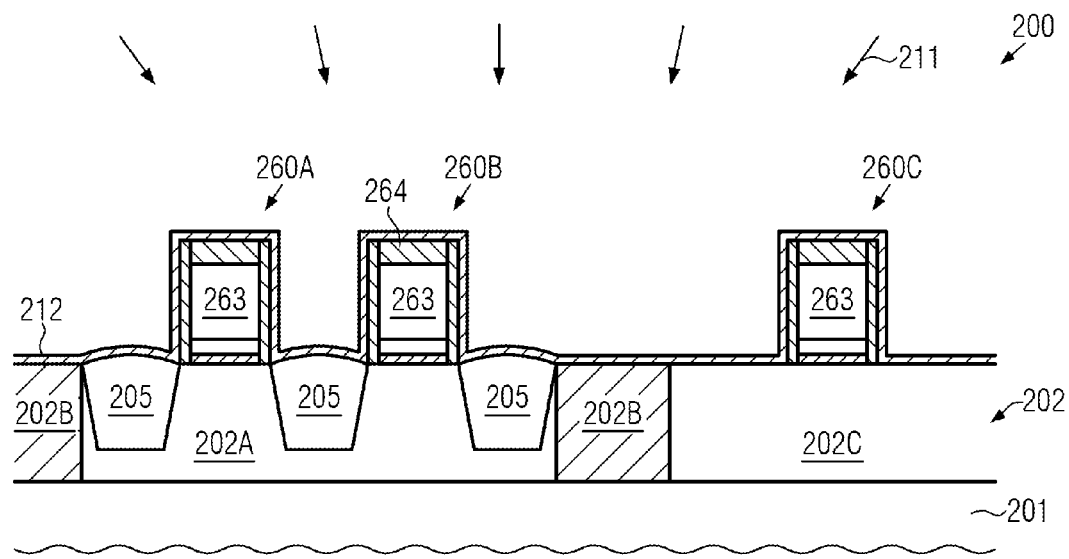

FIG. 2f schematically illustrates the device 200 according to further illustrative embodiments in which a further sacrificial mask layer 212, for instance in the form of a silicon dioxide material, is formed so as to cover the active regions 202A, 202C and the gate electrode structures 260A, 260B, 260C. To this end, any appropriate deposition technique may be applied, for instance by using a high temperature deposition process and the like, so as to obtain the desired material characteristics of the layer 212. It should be appreciated that, in some illustrative embodiments, the layer 212 may be deposited on the mask layer 208 (FIG. 2e), while in other cases the mask layer 208 may be removed prior to depositing the sacrificial mask layer 212. Consequently, by providing the layer 212, integrity of the strain-inducing materials 205 may be preserved during the further processing, i.e., when removing the cap layer 264.

Figure 2G:
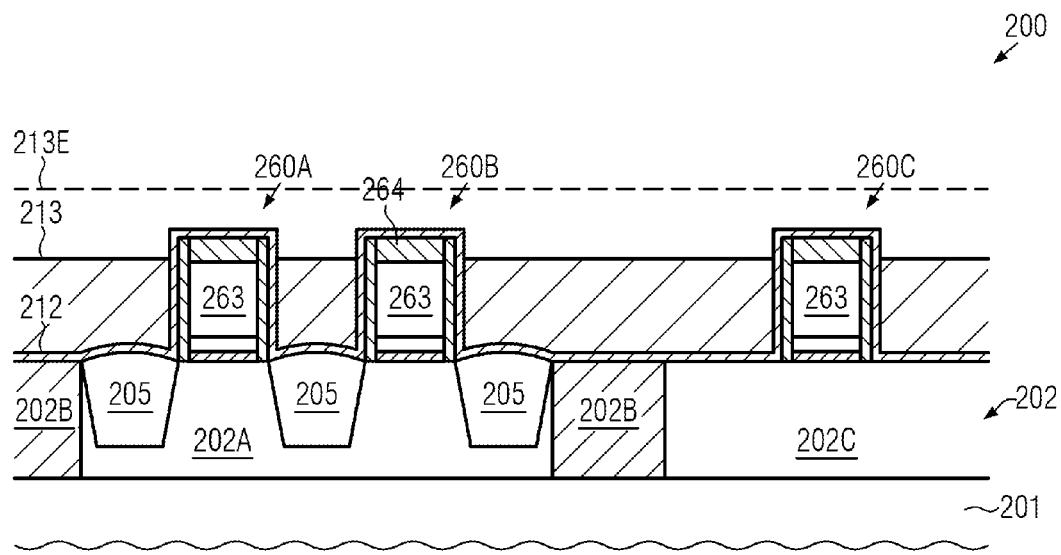

FIG. 2g schematically illustrates the device 200 in a further advanced manufacturing stage according to illustrative embodiments in which a sacrificial fill material 213, such as a resist material or any other appropriate fill material that may be applied in a low viscous state, may be formed above the active regions 202A, 202C and above the gate electrode structures 260A, 260B, 260C. For example, the fill material 213 may be applied by spin coating, wherein an excess portion 213E may be removed by any appropriate etch technique, such as using a developer material and the like. In other cases, any other material removal process may be applied. Hence, during the removal of the excess portion 213E, an appropriate height 213 may be adjusted so as to enable the exposure of the cap materials 264 in a subsequent manufacturing stage. To this end, an exposed portion of the sacrificial cap layer 212 may be removed, for instance, by applying any appropriate etch chemistry, such as diluted hydrofluoric acid and the like, depending on the material composition of the layer 212. In other cases, the excess portion 213E may be removed on the basis of an etch chemistry, which may also efficiently remove the material 212, wherein the etch process may be reliably stopped prior to completely removing the material 213, thereby reliably preserving the material 212 above the active regions 202A, 202C.

Figure 2H:
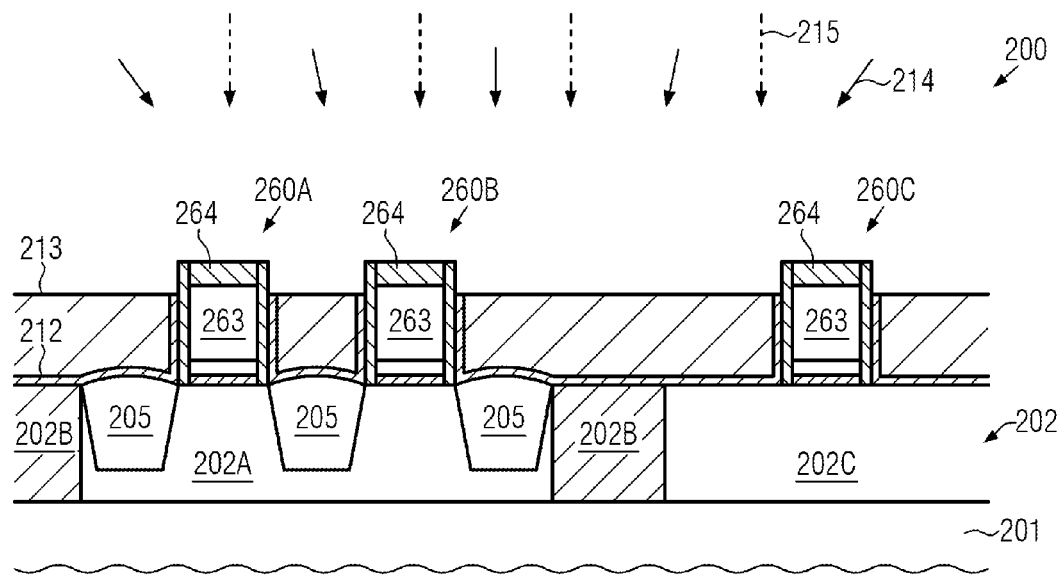

FIG. 2h schematically illustrates the device 200 according to illustrative embodiments in which the material 213 may be recessed so as to expose a portion of the layer 212 as shown in FIG. 2g, and subsequently an appropriate etch process 214 may be applied so as to remove the exposed portion of the layer 212, thereby exposing the cap layers 264. Thereafter, a further etch process 215 may be applied, for instance as a plasma assisted etch process wherein, depending on the degree of material erosion in the layer 213, nevertheless the layer 212 may reliably avoid undue interaction of the active regions 202A, 202C with the reactive etch atmosphere of the process 215. Thus, in particular, any undesired material loss of the strain-inducing semiconductor alloy 205 may be avoided or at least significantly be reduced. Consequently, the removal of the cap layers 264 may substantially not negatively affect the strain-inducing material 205, which is provided in a highly uniform state due to the previous processing, as described above. As a consequence, the further processing may be continued on the basis of a generally superior device topography having the superior uniformity with respect to the strain-inducing material 205, in particular in the vicinity of the isolation region 202B.

Figure 2I:
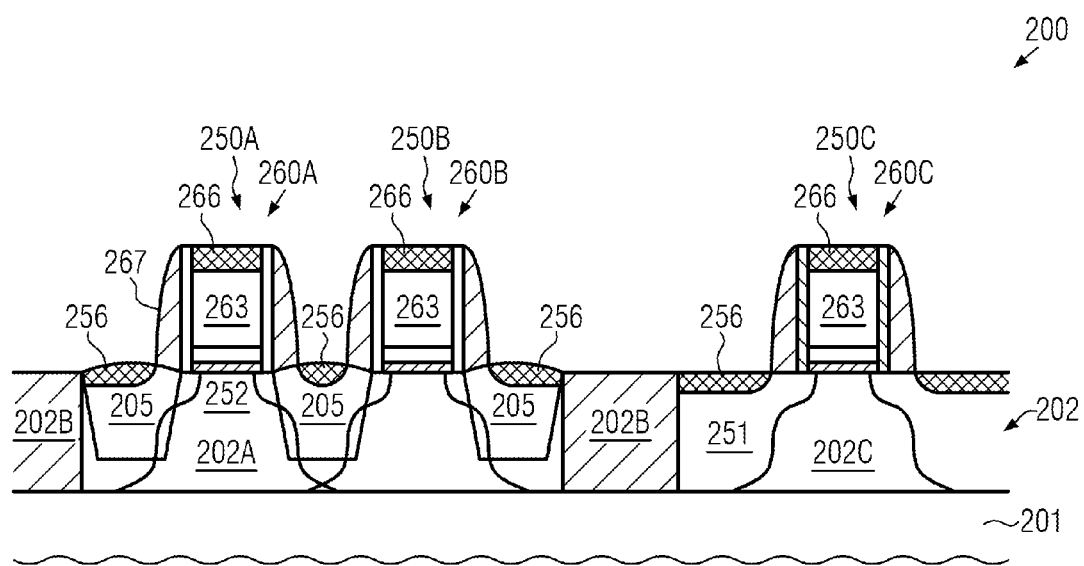

FIG. 2i schematically illustrates the device 200 in a further advanced manufacturing stage. As shown, transistors 250A, 250B, for instance provided in the form of P-channel transistors, are formed in and above the active region 202A, while a transistor 250C is formed in and above the active region 202C, for instance in the form of an N-channel transistor or generally a transistor that does not require the incorporation of the strain-inducing semiconductor material 205. Moreover, as shown, drain and source regions 251 are formed within the active regions 202A, 202C and have any appropriate lateral and vertical dopant profile in accordance with the corresponding transistor characteristics. Furthermore, due to the superior uniformity of the strain-inducing material 205 in the active region 202A, respective metal silicide materials 256 formed therein may have a configuration that is substantially independent from the position within the active region 202A. That is, the metal silicide 256 formed adjacent to the isolation region 202B may have substantially the same thickness and profile as the metal silicide region 256 provided in the central part of the active region 202A. Consequently, the strain induced in a channel region 252 of the transistors 250A, 250B may be enhanced compared to conventional devices in which typically a pronounced shoulder is present at the edge of the active region, as discussed above, and additionally the strain may vary less in the various transistors formed in and above the active region 202A. Consequently, due to the generally increased strain-inducing effect, superior performance may be obtained for the transistors 250A, 250B while transistor characteristics may vary less even if a plurality of transistors are formed in the active region 202A so that any "edge" transistors have substantially the same transistor characteristics as any central transistor devices.

Moreover, a metal silicide 266 may also be formed in the gate electrode structures 260A, 260B, 260C, possibly in combination with an appropriate spacer structure 267. The transistors 250A, 250B, 250C may be formed in accordance with any appropriate process strategy as is, for instance, also described above with reference to the device 100. For example, due to the superior uniformity of the overall device topography above the active region 202A, also the spacer structure 267 may be provided with superior uniformity, thereby even further contributing to a more robust process strategy and thus to less varying transistor characteristics.

Thereafter, the further processing may be continued by forming a device level, as previously explained with reference to the device 100, where any appropriate process strategy may be applied so as to form one or more dielectric materials which may then be patterned in order to provide contact openings. Due to the superior thickness uniformity of the metal silicide regions 256, in particular in the vicinity of the isolation region 202B, the probability of etching through the metal silicide 256 may be significantly reduced compared to conventional strategies, thereby also reducing respective device failures and thus overall production yield.

As a result, the present disclosure provides manufacturing techniques and semiconductor devices in which sophisticated high-k metal gate electrode structures may be formed in an early manufacturing stage in combination with a strain-inducing semiconductor alloy, which is provided on the basis of cavities having superior cross-sectional shapes in order to enhance the growth conditions during the selective epitaxial growth process. Furthermore, additional mechanisms may be implemented so as to substantially reduce a material loss of the strain-inducing semiconductor alloy, thereby achieving superior performance and reduced device variability, while at the same time also reducing yield losses compared to conventional strategies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate electrode structure of a transistor above an active region that is laterally delineated by an isolation region, said active region comprising a semiconductor base material;
   forming a cavity in said active region between said gate electrode structure and said isolation region, wherein forming said cavity comprises performing an etch process in a plasma based etch atmosphere while controlling sidewall angles of said cavity and preserving a portion of said semiconductor base material adjacent to said isolation region so as to laterally delimit said cavity from said isolation region;
   forming a strain-inducing semiconductor alloy in said cavity by using said preserved portion as a seed material; and
   forming drain and source regions of said transistor in said active region.

2. The method of claim 1, wherein performing said etch process comprises introducing oxygen into said plasma based etch atmosphere.

3. The method of claim 1, wherein forming said gate electrode structure comprises forming a spacer structure on sidewalls of an electrode material of said gate electrode structure and on sidewalls of an electrode material of a second gate electrode structure formed above a second active region.

4. The method of claim 3, further comprising forming a mask layer above said second gate electrode structure and said second active region prior to forming said strain-inducing semiconductor material.

5. The method of claim 1, further comprising forming a sacrificial mask layer above said active region and said gate electrode structure after forming said strain-inducing semiconductor material and prior to forming said drain and source regions.

6. The method of claim 5, further comprising exposing a dielectric cap layer of said gate electrode structure and removing said dielectric cap layer in the presence of a remaining portion of said sacrificial mask layer.

7. The method of claim 6, wherein exposing said dielectric cap layer comprises providing a fill material above said gate electrode structure and removing excess material of said fill material.

8. The method of claim 1, wherein forming said gate electrode structure comprises providing a high-k dielectric material in a gate dielectric layer of said gate electrode structure.

9. The method of claim 8, wherein forming said gate electrode structure further comprises forming a metal-containing electrode material above said gate dielectric layer prior to forming said drain and source regions.

10. The method of claim 1, further comprising forming a metal silicide in said strain-inducing semiconductor material and in a silicon-containing electrode material of said gate electrode structure.

11. A method of forming a transistor in a semiconductor device, the method comprising:
   forming a plurality of gate electrode structures above an active region, said active region comprising a semiconductor material and being laterally delineated by an isolation region;
   performing a plasma assisted etch process so as to form cavities in said active region, said cavities being laterally delineated by said semiconductor material, wherein performing said plasma assisted etch process comprises controlling sidewall angles of said cavities so as to preserve semiconductor material laterally between said cavities and said isolation region;
   forming a strain-inducing semiconductor alloy in said cavities; and
   forming drain and source regions in said active region.

12. The method of claim 11, wherein controlling sidewall angles of said cavities comprises using an oxidizing species when performing said plasma assisted etch process.

13. The method of claim 11, further comprising forming a mask layer at least on said strain-inducing semiconductor material and removing a dielectric cap layer of said plurality of gate electrode structures by using said mask layer as an etch mask.

14. The method of claim 13, wherein forming said mask layer comprises depositing a fill material between said plurality of gate electrode structures and removing an exposed portion of said mask layer.

15. The method of claim 11, wherein forming said plurality of gate electrode structures comprises forming a high-k dielectric material and a metal-containing electrode material prior to forming said drain and source regions.

16. The method of claim 15, further comprising forming a metal silicide in said drain and source regions and in a silicon-containing electrode material of said plurality of gate electrode structures.

17. The method of claim 11, wherein controlling sidewall angles of said cavities comprises oxidizing sidewall surfaces of said cavities when performing said plasma assisted etch process.

18. A method, comprising:
forming a gate electrode structure of a transistor above an active region that is laterally delineated by an isolation region, said active region comprising a semiconductor base material;
performing a plasma assisted etch process in an oxygen-containing etch ambient to form a cavity having angled sidewall surfaces in said active region between said gate electrode structure and said isolation region, wherein forming said cavity comprises forming an oxide material layer on said angled sidewall surfaces during said plasma assisted etch process;
performing a selective epitaxial growth process to form a strain-inducing semiconductor alloy in said cavity; and
forming drain and source regions of said transistor in said active region.

19. The method of claim 18, further comprising controlling an angle of said angled sidewall surfaces during said plasma assisted etch process so as to preserve a portion of said semiconductor base material laterally between said cavity and said isolation region.

20. The method of claim 18, further comprising removing said oxide material layer from said angled sidewall surfaces prior to performing said selective epitaxial growth process.

* * * * *